(12) United States Patent
Takahashi

(10) Patent No.: US 6,682,343 B2
(45) Date of Patent: Jan. 27, 2004

(54) SUBSTRATE PROCESSING APPARATUS

(75) Inventor: Nobuyuki Takahashi, Kanagawa (JP)

(73) Assignee: Anelva Corporation, Tokyo (JP)

( * ) Notice: Subject to any disclaimer, the term of this patent is extended or adjusted under 35 U.S.C. 154(b) by 262 days.

(21) Appl. No.: 09/927,932

(22) Filed: Aug. 13, 2001

(65) Prior Publication Data
US 2002/0021952 A1 Feb. 21, 2002

(30) Foreign Application Priority Data
Aug. 14, 2000 (JP) ........................................ 2000-245768

(51) Int. Cl.$^7$ .................................................. F27B 9/02
(52) U.S. Cl. ........................... 432/128; 432/121; 432/5; 432/11; 414/217; 414/940
(58) Field of Search .................... 432/5, 6, 11, 128, 432/121, 241, 253, 258; 219/390, 405, 411; 392/416, 418; 118/724, 725, 728; 414/217, 935, 940

(56) References Cited

U.S. PATENT DOCUMENTS 4,405,435 A * 9/1983 Tateishi et al. ............. 118/719
4,993,559 A * 2/1991 Cota ........................ 211/41.18
5,379,984 A   1/1995 Coad et al.
5,738,767 A   4/1998 Coad et al.

FOREIGN PATENT DOCUMENTS

JP           06-69316        3/1994
JP           2000-177842     6/2000

* cited by examiner

Primary Examiner—Jiping Lu
(74) Attorney, Agent, or Firm—Kanesaka & Takeuchi

(57) ABSTRACT

A substrate processing apparatus includes a substrate holder for holding a substrate with a holding angle of 45 degrees to 90 degrees with respect to a horizontal plane, a conveying system to convey the substrate with the substrate holder, a process chamber in which the substrate is processed, a load-lock chamber in which the substrate temporarily stays, and an intermediate chamber provided between the process chamber and the load-lock chamber. The conveying system conveys the substrate along the first direction from the load-lock chamber to the intermediate chamber, and from the intermediate chamber to the process chamber, and also conveys the substrate along the second direction perpendicular to the first direction.

11 Claims, 7 Drawing Sheets

SUBSTRATE PROCESSING APPARATUS

BACKGROUND OF THE INVENTION

The invention of this application relates to a substrate processing apparatus used preferably for manufacturing display devices such as liquid crystal displays.

In manufacturing display devices such as liquid crystal displays and plasma displays, it is necessary to carry out a process onto a board-shaped material, which becomes the base of a device. This material is generally called "substrate" in this specification. In manufacturing liquid crystal displays, for example, a process to form a transparent electrode onto the front surface of a glass substrate is required.

Substrate processing apparatuses used for such a process comprise a chamber so that a substrate can be processed in a required environment. The chamber often comprises a pumping system to pump itself at a vacuum pressure or a gas-introduction system to introduce a required gas into itself. The substrate processing apparatuses often comprise a multiplicity of the chambers so that dissimilar processes can be carried out continually, or pressure can be reduced gradually from the atmosphere.

The conventional substrate processing apparatuses are classified into a couple of categories. One is called in-line type, and the other one is called cluster-tool type.

FIG. 6 schematically shows an in-line type apparatus as an example of conventional substrate processing apparatuses. The in-line type apparatus comprises a multiplicity of chambers 11, 2, 3, 12 provided in a line. A conveying system that conveys a substrate 9 through the chambers 11, 2, 3, 12 is provided. A gate valve 10 is provided at each boundary of the chambers 11, 2, 3, 12.

The substrate 9 is placed on a tray, which is conveyed to each chamber 11, 2, 3, 12 in this order by the conveying system. One of the chambers is a load-lock chamber 11 that is opened to the outside atmosphere when the substrate 9 is conveyed in. Another one of the chambers is an unload-lock chamber 12 that is opened to the outside atmosphere when the substrate 9 is conveyed out. One of rest chambers is a process chamber 2, i.e., chamber for process. Provided between the process chamber 2 and the load-lock chamber 11, and between the process chamber 2 and the unload-lock chamber 12 are the buffer chambers 3. The buffer chamber 3 is provided considering large pressure difference of the load-lock chamber 11 and the unload-lock chamber 12 from the process chamber 2. The buffer chambers 3 moderate the difference by maintaining the intermediate pressure of the difference.

As shown in FIG. 6, the conveying system conveys the tray 91 on which the substrate 9 is placed, by conveying rollers 41. The conveying rollers 41 are provided at both ends of a rotary rod, which are provided horizontally and perpendicularly to the conveying direction. The conveying system is composed of a multi-combination of the rotary rods and the couples of the conveying rollers 41, which are arrayed along the conveying direction. As shown in FIG. 6, the substrate 9 is conveyed and processed posing horizontally.

On the other hand, FIG. 7 schematically shows a cluster-tool type apparatus as another example of conventional substrate processing apparatuses. The cluster tool type apparatus has the layout where a load-lock chamber 11 and a plurality of process chambers 2 are provided around a transfer chamber 5 having a transfer robot 42. The example shown in FIG. 7 has two load-lock chambers 11. Gate valves 10 are provided between the transfer chamber 5 and each load-lock chamber 11, and between each transfer chamber 5 and the process chamber 2.

The transfer robot 42 takes a substrate 9 out of one load-lock chambers 11 and transfers it to each process chamber 2 in order. After the whole processes are finished, the transfer robot 42 returns the substrate 9 to the one or the other load-lock chambers 11. Though the chambers 11 in FIG. 7 have the function as an unload-lock chamber, the name "load-lock chamber" is still used.

The transfer robot 42 comprises a multi-jointed arm on top of which the substrate 9 is aboard. The transfer robot 42 transfers the substrate 9 by expansion-contraction, rotation and up-and-down motion of the arm. The substrate 9 keeps posing horizontally during transferring and during processes in process chambers 2.

Substrate-size enlargement is prominent tendency in the above-described substrate processing apparatuses. For example, not only as computer displays, but also liquid crystal displays and plasma displays are supposed to be made practical as on-the-wall television displays in the near future. Display area in the on-the-wall television displays is wider than that of the computer displays. Therefore, the substrates are enlarged as well. Besides, there is common tendency to produce a number of products from one substrate for improving productivity or reducing manufacturing cost. This is also bringing the enlargement of substrates.

With the substrate enlargement tendency at the background, the conventional substrate apparatuses bear, or will bear, following problems. First, in both of the in-line type and the cluster-tool type, a substrate keeps posing horizontally during conveying (or transferring) and processing. Therefore, when the substrate is enlarged, horizontal occupation area of each chamber is inevitably enlarged as well. As a result, the whole occupation area of the apparatus must be enlarged as well.

In the in-line type apparatus shown in FIG. 6, when each chamber 11, 2, 3, 12 is enlarged, the line length of the apparatus must be enlarged. In the manufacture of family-use on-the-wall television displays, it is supposedly required to process a substrate of about 1×1.2 meter size. The in-line type apparatus that processes the substrate of this size would have the line-length of ten and several meters.

In the cluster-tool type apparatus shown in FIG. 7, the substrate enlargement directly brings the occupation area enlargement of each chamber, leading to increase of the whole occupation area of the apparatus. What is most serious in the cluster type is enlargement of the transfer chamber 5. As understood from FIG. 7, though the rotation axis of the transfer robot 42 is on the center of the transfer chamber 5, the substrate 9 is rotated apart from the center of the transfer chamber 5, because the substrate 9 is aboard on the top of the arm. Therefore, radius of the horizontal circular space necessary for the substrate rotation, hereinafter called "required space radius", is more than twice of side length of the substrate. Therefore, when the substrate 9 is enlarged, the required space radius is doubled, enlarging the transfer chamber 5 more. For example, when the described substrate of 1×1.2 meter size is processed, the required space radius easily exceeds 2 meters.

The transfer chamber 5 often needs to be pumped by a pumping system. When the transfer chamber 5 is enlarged, there arise problems that longer time is necessary for pumping at a required pressure, and higher cost is necessary for a high-performance pumping system 1. Besides, such the transfer chamber 5 is essentially unnecessary for the substrate process. This is not preferable design that such the unnecessary member occupies large space in the apparatus.

The second problem brought from the substrate enlargement at the background, is a bending of substrates. In display devices such as liquid crystal displays, to make a device thinner is great demand of the market as well as to make display area wider. From this demand, substrates do not tend to be thicker, rather tend to be thinner, nevertheless they are being enlarged. For example, thickness of the described substrate of 1×1.2 meter size is just about 0.7 mm.

When such a thin substrate is conveyed (or transferred) and processed posing horizontally, the problem that the substrate bends from its weight arises. In the in-line type apparatus, for example, the substrate 9 easily bends downward at the portions not in contact with the conveying rollers 41. In the cluster-tool type apparatus as well, the substrate 9 bends at the sides not in contact with the arm.

When a process is carried out on a bending substrate, the process may lose homogeneity, which might bring a performance defect such as display unevenness. Besides, because non-uniform stress resides in the substrate 9, probability of substrate breaking may increase, decreasing product reliability.

For the cluster-tool type apparatus, practically it is becoming impossible to transfer the enlarged substrate 9 by the transfer robot 42. It is required to increase size and hardness of the arm sufficiently. In addition, it is required to carry out expansion-contraction, rotation and up-and-down motion of such the large-scale arm with high accuracy. However, it is very difficult to fabricate such the large-scale motion mechanism with sufficient accuracy. Therefore, transfer by the multi-joint arm robot is supposed to reach the practical limit in near future.

The third problem brought from the substrate enlargement at the background is the one concerning maintenance of apparatuses. Chambers composing an apparatus are capable of being opened for maintenance. For example, when a conveying (or transferring) error happens in a chamber, the inside of the chamber is checked after stopping operation of the apparatus. In case that the substrate is found not rightly on the conveying rollers or the arm, the substrate is restored to the right position, then resuming operation of the apparatus.

The chambers have a door for such maintenance. Usually, the upper board of the chambers is installed with a hinge so that it can be used as the door for checking the substrate. After opening the upper board, it is checked whether any foreign matter does not exist on the front surface of the substrate by eye observation.

However, when a chamber is enlarged from the substrate enlargement, the door is also enlarged. In case a substrate is enlarged to the described size, size of the door easily may exceed 1 ü~1 meter. When the door is enlarged to such a size, it is no longer possible to open it by human force. A large-scale mechanism such as a crane would be required.

SUMMARY OF THE INVENTION

An object of this invention is to solve the problems described above. To accomplish this object, the invention presents a substrate processing apparatus comprising a substrate holder holding a substrate with a holding angle of 45 degrees to 90 degrees, a conveying system to convey the substrate by moving the substrate holder, a process chamber in which the substrate is processed, a load-lock chamber in which the substrate temporarily stays in conveying between the outside atmosphere and the process chamber, and an intermediate chamber provided between the process chamber and the load-lock chamber. The holding angle is the angle made of the substrate and the horizon. The conveying system conveys the substrate between the load-lock chamber and the intermediate chamber, and between the intermediate chamber and the process chamber. The conveying system conveys the substrate along the first direction, which is the direction from the load-lock chamber to the intermediate chamber or the direction from the intermediate chamber to the process chamber. Additionally, the conveying system conveys the substrate along the second direction that is perpendicular to the first direction.

DETAILED DESCRIPTION OF THE PREFERRED EMBODIMENTS

Figure 1:
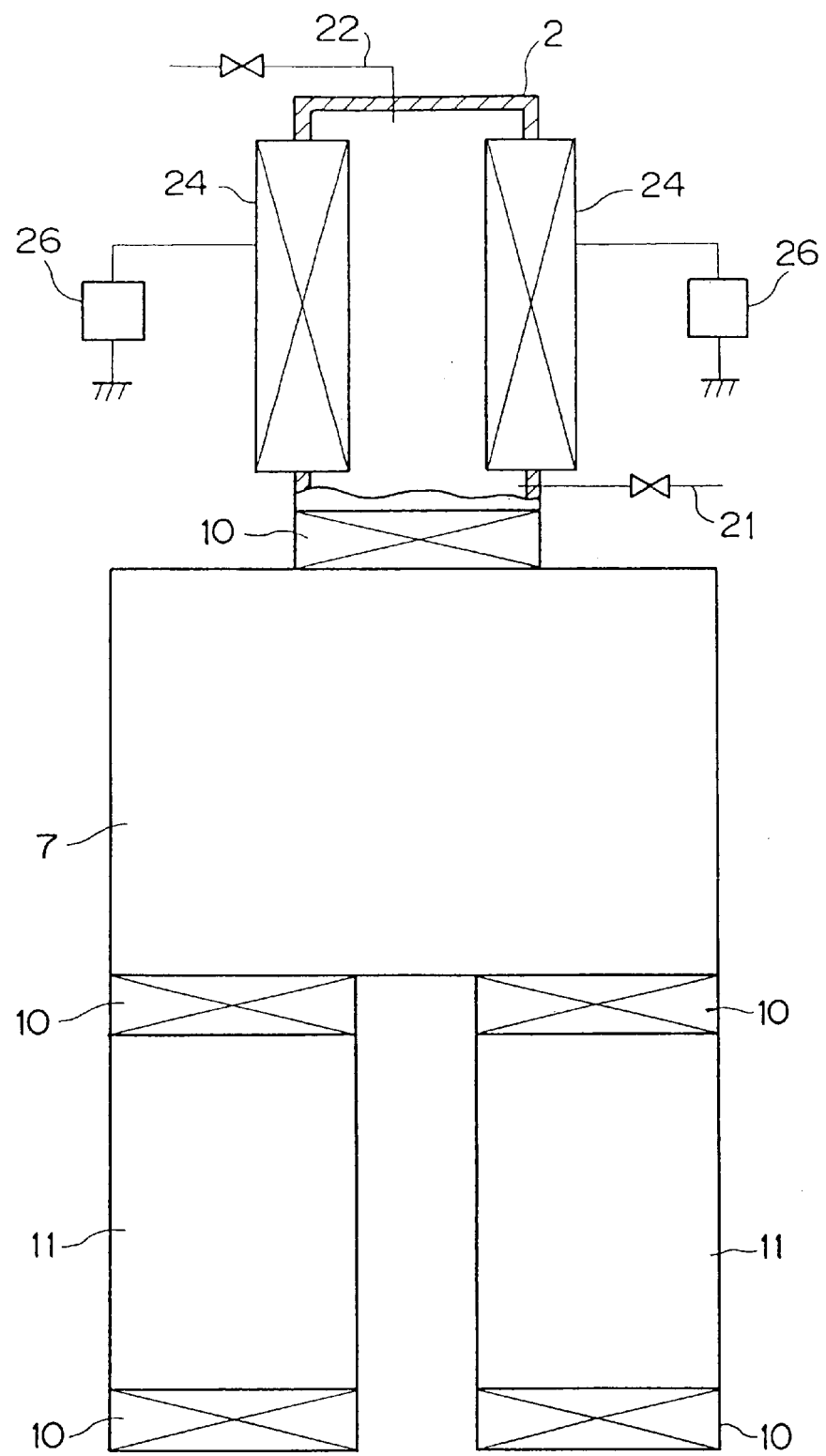
FIG. 1 is a schematic plan view of the apparatus of the first embodiment.

The preferred embodiments of the invention are described as follows. Though the invention is applicable to an apparatus carrying out any kinds of processes, the apparatus described as follows is, for example, the one carrying out sputtering. The apparatus of the first embodiment is described using FIG. 1. FIG. 1 is a schematic plane view of the apparatus of the first embodiment.

As shown in FIG. 1, the apparatus comprises one process chamber 2, one intermediate chamber 7, two load-lock chambers 11, and a conveying system (not shown in FIG. 1) that conveys a substrate (not shown in FIG. 1) by moving a substrate holder (not shown in FIG. 1) holding the substrate. The process chamber 2 is connected airtightly with one side of the intermediate chamber 7, and each load-lock chamber 11 is connected airtightly with the other side of the intermediate chamber 7 in parallel. At each connection is provided a gate valve 10.

Each chamber 11, 2, 7 is the airtight vacuum chamber, which is pumped by a pumping system (not shown in FIG. 1). Outside the load-lock chambers 11, there is a load station where an unprocessed substrate is loaded to the substrate holder and a processed substrate is unloaded from the substrate holder.

Figure 2:
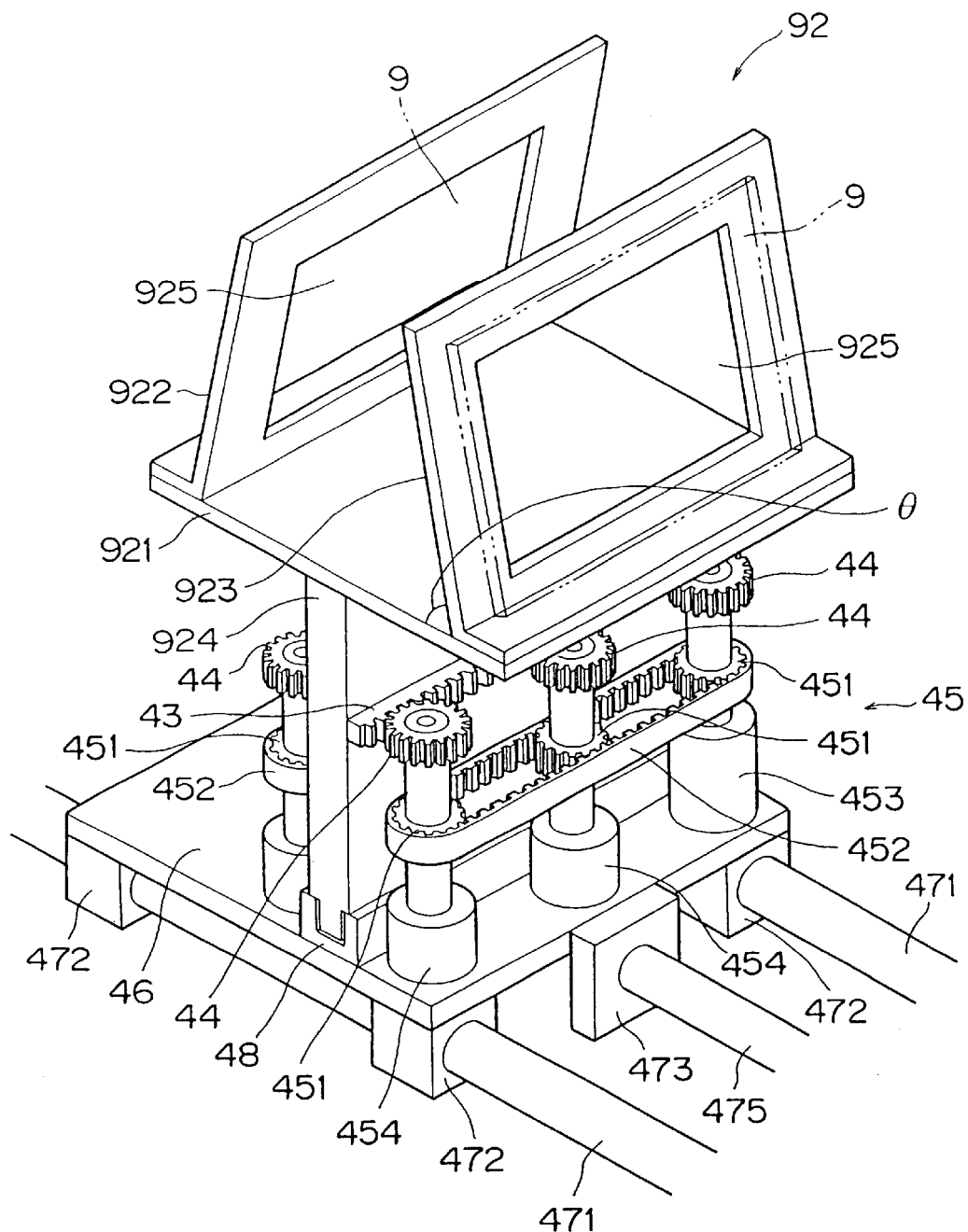
FIG. 2 is a schematic perspective view of the substrate holder and the conveying system in the first embodiment.

The first point greatly characterizing the apparatus of this embodiment is that the substrate holder holds the substrate, making it vertical or nearly vertical. In other words, the front surface of the substrate held by the substrate holder makes the angle of 45 to 90 degree against the horizon. This angle is hereinafter called "holding angle". The substrate is conveyed by the conveying system and processed, keeping this holding angle The substrate holder and the conveying system are described in detail using FIG. 2. FIG. 2 is a schematic perspective view of the substrate holder and the conveying system in the first embodiment. The substrate holder 92 shown in FIG. 2 is mainly composed of an intermediate board 921 posing horizontally, a couple of susceptor boards 922,923 fixed upward on the intermediate board 921, and a support board 924 fixed downward at the under surface of the intermediate board 921. The susceptor boards 922,923 are curved at the bottom margins. The susceptor boards 922,923 are fixed on the intermediate board 92 at the curved margins. The each upright part of the susceptor boards 922,923, which is hereinafter called "main part", faces each other, declining to each other. The angle of the main part of the each susceptor board 922,923 against the horizon, which is designated by θ, is 45 to 90 degrees. This angle θ corresponds to the holding angle.

Each main part of the susceptor boards 922, 923 has a rectangular opening 925. The substrate 9 processed in the apparatus of this embodiment is supposed to be rectangular. The openings 925 of the susceptor boards 922, 923 are a little smaller than the substrate 9. Each substrate 9 is held by each susceptor board 922, 923 contacting with the main part, i.e., leaning on the main part. Each opening 925 is shut by each held substrate 9.

The support board 924 is provided vertically from the center of the under surface of the intermediate board 921. In the side view, the support board 924 forms "T" together with the intermediate board 921. The direction of the upper edge of the support board 924 fixed on the intermediate board 921 is in parallel to the side edge of the intermediate board 921. The upper edge and the bottom edge of the held substrate 9 are also in parallel to the side edge of the intermediate board 921.

The conveying system conveys the substrate 9 by a rack-and-pinion mechanism in this embodiment. Concretely, racks 43 are provided at both sides of the support board 924. The rack 43 is lengthened along a horizontal direction corresponding to the side edge of the intermediate board 921.

The conveying system is mainly composed of a multiplicity of pinions 44 engaging with the racks 43, and pinion drive units 45. The pinion drive unit 45 is mainly composed of each driving gear 451 jointed with each pinion 44 through a driving rod, and a timing belt 452 wound around a group of the driving gears 451, a motor 453 jointed with one of the driving gears 451, and axle supports 454 supporting axles of the rest of the driving gears 451.

In FIG. 2, when the motor 453 is operated, the rotation is moved to each driving gear 451 by the timing belt 452. This rotation is moved to each pinion 44 via each axis. The rack is moved horizontally by the rotation of each pinion 44, thereby making the substrate holder 92 move horizontally as a whole. As a result, the substrate 9 held on the substrate holder 92 is conveyed.

As shown in FIG. 2, there is a guide rail 48 that supports the whole substrate holder 92 and guides movement of the substrate holder 92. The guide rail 48 has a groove into which the bottom end of the support board 924 is inserted. The bottom end of the support board 924 can move smoothly by such members as bearings provided on the inner face of the groove. A magnetic floating mechanism that makes the bottom end of the support board 924 float up in the groove is preferably employed, because it enables to prevent contaminants such as dusts from releasing from the groove.

Combinations of the pinion 44, the pinion drive unit 45 and the guide rail 48 are provided in each load-lock chamber 11, the intermediate chamber 7, the process chamber 2, and the load station (not shown). When each pinion 44 is driven by each pinion drive unit 45 at each place, the substrate holder 82 is moved along the lengthened direction of the rack 43, thereby conveying the substrate 9 from the load station to the process chamber 2 through one of the load-lock chambers 11 and the intermediate chamber 7.

As understood from FIG. 1, the direction from each load-lock chamber 11 and the intermediate chamber 7 corresponds to the direction from the intermediate chamber 7 to the process chamber 2. The conveying direction of the described rack-and-pinion mechanism also corresponds to this direction. This direction is hereinafter called "the first direction". Still, it is not indispensable that the direction from each load-lock chamber 11 to the intermediate chamber 7 corresponds to the direction from the intermediate chamber 7 to the process chamber 2. If the former does not correspond to the latter, either direction would be the first direction.

Figure 3:
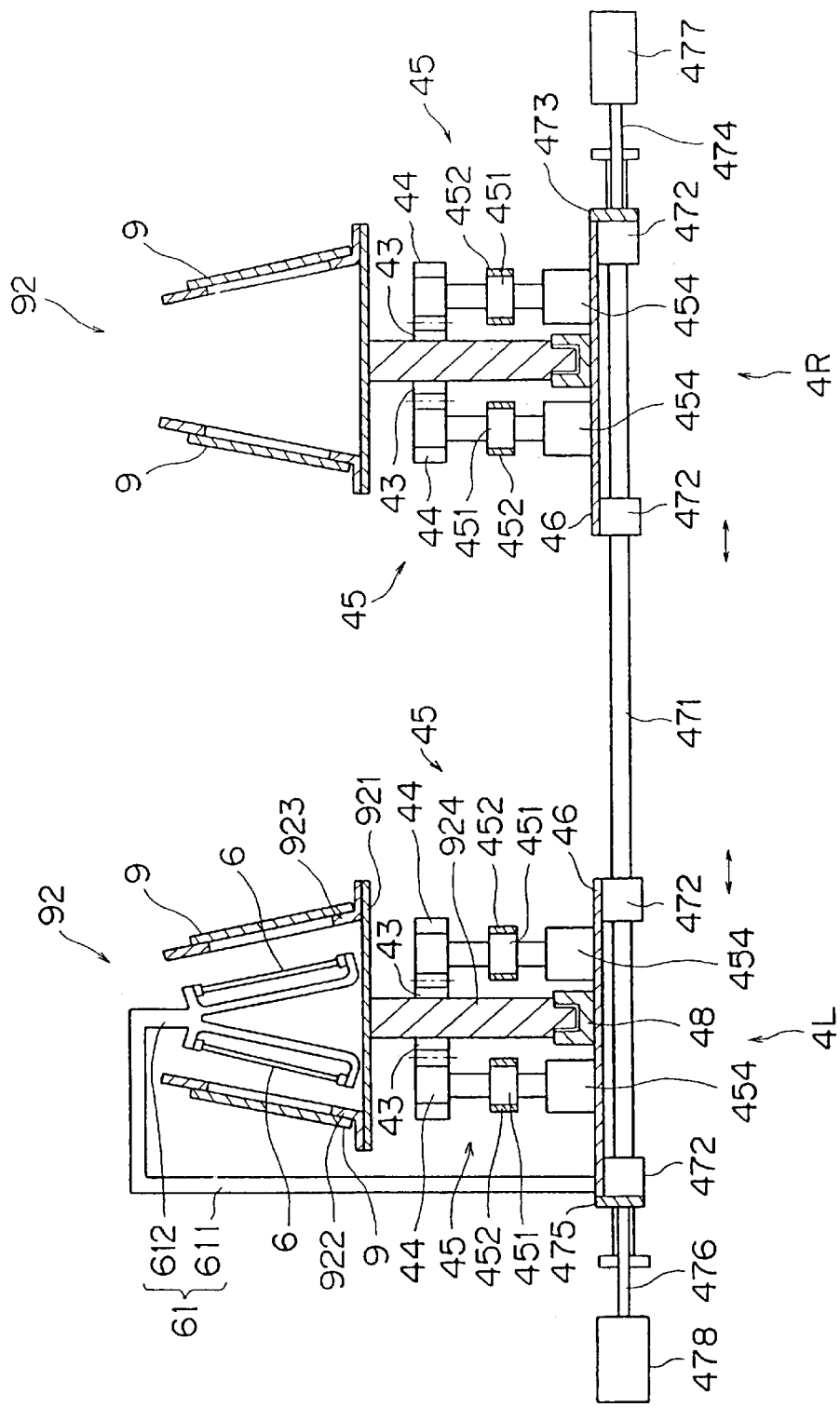
FIG. 3 is a schematic front view of the conveying system in the intermediate chamber 7.

The second point greatly characterizing this embodiment is that the substrate 9 can be conveyed along, in addition to the first direction, the second direction that is perpendicular to the first direction. This point is described using FIG. 2 and FIG. 3. FIG. 3 is a schematic front view of the conveying system in the intermediate chamber 7.

As shown in FIG. 3, there are a couple of combinations of the pinion 44, the pinion drive unit 45 and the guide rail 48, which are laid out at the left and right. The pinion 44, the pinion drive unit 45 and the guide rail 48 of each combination are fixed on the base board 46. The respective base boards 46 are on the same horizontal plane. The right-side combination of the pinion 44, the pinion drive unit 45, the guide rail 48 and the base board 46, is hereinafter called "right conveying mechanism 4R". The left-side combination of the pinion 44, the pinion drive unit 45, the guide rail 48 and the base board 46, is hereinafter called "left conveying mechanism 4L". The right conveying mechanism 4R and the left conveying mechanism 4L have essentially the same composition. FIG. 2 shows the right conveying mechanism 4R in FIG. 3.

As shown in FIG. 3, beneath the base boards 46 of the both conveying mechanisms 4R, 4L guide rods 471 are provided. As shown in FIG. 2, the number of the guide rods 471 is two. Distance of the guide rods 471 is a little narrower than width of each base board 46. Linear bearings 472 are provided on the under surface of each base board 46. Each linear bearing is located on each corner of the under surface of the base board 46.

As shown in FIG. 3, a right drive rod 474 is fixed by a right fixation board 473 on the right side of the base board 46 in the right conveying mechanism 4R. A left drive rod 476 is fixed by a left fixation board 475 on the left side of the base board 46 in the left conveying mechanism 4L. A right linear actuator 477 is connected with the right drive rod 474, and a left linear actuator 478 is connected with the left drive rod 476. The linear actuators 477, 478 are, for example, air cylinders.

When the right linear actuator 477 is operated, the whole right conveying mechanism 4R is moved linearly being guided by the guide rods 471. As a result, the substrate holder 92 is moved together, conveying the substrates 9 thereby. On the other hand, when the left linear actuator 478 is operated, the whole left conveying mechanism 4L is moved linearly being guided by the guide rods 471. As a result, the substrate holder 92 is moved together, conveying the substrates 9 thereby.

As understood from the above description, the conveying direction of the substrates 92 corresponds to the lengthening direction of the guide rods 471. The lengthening direction of the guide rods 471 is the second direction. Therefore, the substrate 9 can be conveyed along the second directions in addition to the first direction.

The third point greatly characterizing this embodiment is that the substrate 9 is heated by a heater 6 in the intermediate chamber 7 prior to a process in the process chamber 2. In this embodiment, a ceramic heater is adopted as the heater 6. The ceramic heater is panel-shaped and provided in parallel to the substrate 9 held on the substrate holder 92.

The heater 6 is, as shown in FIG. 3, installed on the base board 46 of the left conveying mechanism 4L by a bracket ü@61. The bracket 61 is composed of a support portion 611 fixed on the base board 46 and a heater holder 612 provided with the support portion 611. As shown in FIG. 3, the support portion 611 is curved horizontally at the top where the heater holder 612 is suspended.

The heater holder 612 holds the panel-shaped heater 6 at its top and bottom. The heater holder 61 contains a cable connecting the heater 6 and a power supply (not shown) in the inside. As shown in FIG. 3, the heater holder 612 has a symmetric configuration, holding a couple of heaters 6 at the left and right. Therefore, a couple of the substrates 9 are heated simultaneously. The described each opening 925 of the susceptor boards 923, 924 passes through the irradiation from the heaters 6 sufficiently to the substrate 9.

Figure 4:
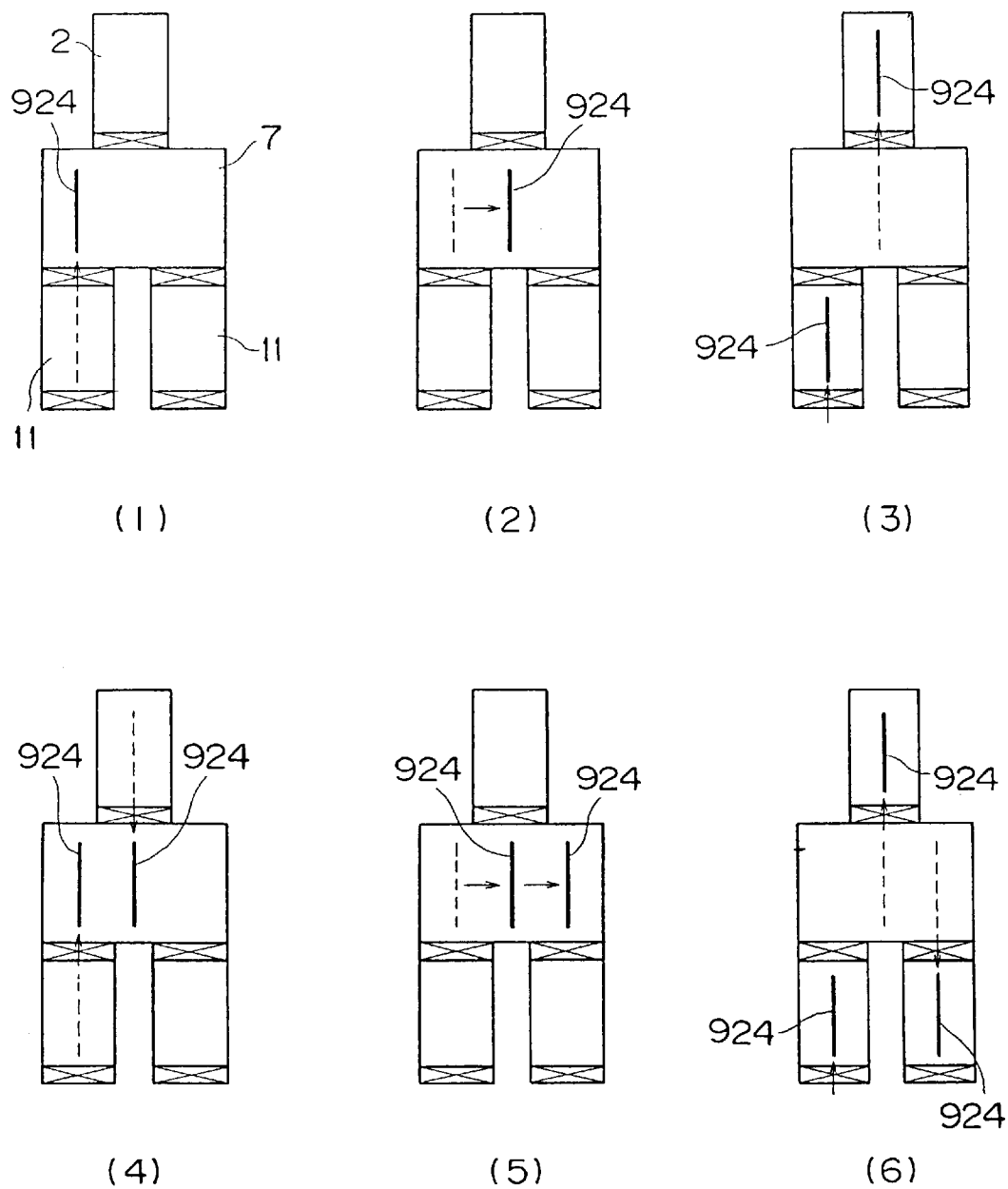
FIG. 4 is a schematic plan view explaining the operation of the apparatus of the first embodiment.

Operation of the conveying system is described using FIGS. 4(1)–4(6). FIGS. 4(1)–4(6) are schematic plan views explaining the operation of the apparatus of the first embodiment. In FIGS.4 (1)–4(6), only the support boards 924 appear for designating positions of the substrate holders 92.

First, the substrate holder 92 holding a couple of unprocessed substrates 9 moves to the left load-lock chamber 11. After closing the gate valve 10 between the left load-lock chamber 11 and the atmosphere, the gate valve 10 between the left load-lock chamber 11 and the intermediate chamber 7 is opened. Then, the conveying system moves the substrate holder 92 to the intermediate chamber 7, as shown in FIG. 4(1).

Concretely, the left actuator 478 is operated in advance, aligning the left conveying mechanism 4L with the conveying mechanism in the left load-lock chamber 11 (not shown). In other words, the row of the guide rail 48 and the pinion 44 of the left conveying mechanism 4L is aligned with those in the left load-lock chamber 11. This position of the left conveying mechanism 4L is hereinafter called "left-side conveying position".

In this state, when the pinion drive unit 45 in the left load-lock chamber 11 and the pinion drive unit 45 of the lest conveying mechanism 4L are operated simultaneously, the substrate holder 92 is released from the conveying mechanism in the left load-lock chamber 11 and accepted with the left conveying mechanism 4L in the intermediate chamber 7. Operation of each pinion drive unit 45 is stopped when the substrate holder 92 reaches a required position on the base board 46. Afterward, the gate valve 10 between the left load-lock chamber 11 and the intermediate chamber 7 is closed.

When the substrate holder 92 is accepted with the left conveying mechanism 4L, each substrate 9 held on it faces the heater 6. The heaters 6 are operated for the pre-heating of the unprocessed substrates 9 when they are conveyed into the intermediate chamber 7 as described.

After finishing the pre-heating, the left conveying mechanism 4L prepares to move the substrate holder 92 to the process chamber 2. Concretely, by operating the left linear actuator 478 again, the substrate holder 92 is moved to the center of the intermediate chamber 7, as shown in FIG. 4(2). This position is the one where the row of the guide rail 48 and the pinion 44 is aligned with counterparts in the process chamber 2. This position is hereinafter called "process-side conveying position". Meanwhile, the right conveying mechanism 4R stays back at a right-side position in the intermediate chamber 7.

In this state, after opening the gate valve 10 between the intermediate chamber 7 and the process chamber 2, the pinion drive unit 45 of the left conveying mechanism 4L and the pinion drive unit in the process chamber 2 (not shown) are operated simultaneously to move the substrate holder 92 to the process chamber 2.

During the process in the process chamber 2, the left conveying mechanism 4L takes the posture for accepting the next substrates 9. Concretely, as shown in FIG. 4(3), the next substrate holder 92 holding the next couple of the unprocessed substrates 9 is moved to the left load-lock chamber 11. The left linear actuator 478 is operated again to move the left conveying mechanism 4L to the left-side conveying position. Then, the conveying mechanism in the left load-lock chamber 11 and the left conveying mechanism 4L in the intermediate chamber 7 are operated simultaneously to move the next substrate holder 92 into the intermediate chamber 7. During the process of the first couple of the substrates 9 in the process chamber 2, the next couple of the substrates 9 held on the next substrate holder 92 are pre-heated by the heaters 6.

After finishing the process in the process chamber 2, the first substrate holder 92 is moved to the right load-lock chamber 11 by the right conveying mechanism 4R in the intermediate chamber 7. Concretely, the right linear actuator 477 is operated to move the right conveying mechanism 4R to the process-side conveying position. Opening the gate valve 10 between the process chamber 2 and the intermediate chamber 7, the pinion drive unit 45 in the process chamber 2 and the pinion drive unit 45 of the right conveying mechanism 4R are operated simultaneously to move the first substrate holder 92 from the process chamber 2 to the intermediate chamber 7, as shown in FIG. 4(4). The first substrate holder 92 is accepted with the right conveying mechanism 4R. Each pinion drive unit 45 is stopped when the first substrate holder 92 reaches the required position on the base board 46.

Afterward, as shown in FIG. 4(5), the right linear actuator 477 is operated to return the right conveying mechanism 4R to the original position. This position is the one where the row of the guide rail 48 and the pinion 44 are aligned with those in the right load-lock chamber 11. This position is hereinafter called "right-side conveying position". After opening the gate valve 10 between the intermediate chamber 7 and the right load-lock chamber 11, the first substrate holder 92 is moved to the right load-lock chamber 11, as shown in FIG. 4(6). After closing the gate-valve 10 between the intermediate chamber 7 and the right load-lock chamber 11, the right load-lock chamber 11 is vented to be the atmospheric pressure. Then, opening the gate valve 10 between the right load-lock chamber 11 and the atmosphere, the first substrate holder 92 is moved out to the load station.

Simultaneously, as shown in FIGS. 4(5) and 4(6), the next substrate holder 92 is moved to the process chamber by the same operation. The next to the next substrate holder 92 is moved into the left load-lock chamber 11. The left conveying mechanism 4L is returned to the left-side conveying position to accept this substrate holder 92.

Carrying out the described operation, each substrate holder 92 is moved to the left load-lock chamber 11, the left conveying mechanism 4L, the process chamber 2, the right conveying mechanism 4R, and the right load-lock chamber 11 in this order for conveying and processing the substrates 9. The substrate holder 92 moved out of the right load-lock chamber 11 holds another couple of the unprocessed substrates 9, and is moved to the left load-lock chamber 11 again.

As understood from the above description, two or three (or four in case) substrate holders 92 are loaded in the apparatus simultaneously. During the process in the process chamber 2, the pre-heat of the substrates 9 and convey-in-and-out of the substrates 9 via the load-lock chambers 11 are carried out. Therefore, the apparatus is highly productive.

In the described apparatus, the inlet of the guide rail 48 preferably has a configuration easy to accept the bottom end of the support board 924. In the conveying operation, the substrate holder 92 transits from a backside guide rail 48 to a foreside guide rail 48. If the bottom end of the support board 924 is not inserted rightly into the foreside guide rail 48, it could be a conveying error. To prevent the conveying error, the inlet of the guide rail 48 should have such configuration as a taper so that it can accept the bottom of the support board 924 easier.

Next, using FIG. 1 again, the process chamber 2 is described in detail. As described, the apparatus of this embodiment is the sputtering apparatus. Therefore, sputtering is carried out in the process chamber 2. Concretely, as shown in FIG. 1, the process chamber 2 comprises a pumping system 21 pumping the inside, and a gas introduction system 21 introducing a gas for sputtering into the inside. The pumping system 21 can pump the process chamber 2 at about 10-3 to 10-5 Pa by such a vacuum pump as a turbo-molecular pump or cryogenic pump. The gas introduction system 22 can introduce argon or nitrogen as the gas for sputtering at a required flow rate.

As shown in FIG. 1, a couple of sputtering cathodes 24 are provided with the process chamber 2. The sputtering cathodes 24 are installed airtightly with the wall of the process chamber 2. Each sputtering cathode 24 is mainly composed of a target of which sputtered surface is exposed to the inside of the process chamber 2, and a magnet unit provided at the back of the target.

The target is made of the same material as that of a thin film deposited on the substrate 9. For homogeneity of the thin film deposition, the target preferably faces in parallel to the substrate 9. The magnet unit enables the magnetron sputtering. A sputtering power source 26 for the sputtering discharge is connected with each sputtering cathode 24. Each sputtering power source 26 generates high negative DC voltage or high-frequency AC voltage.

In the described conveying operation, the substrates 9 are stopped at the positions where they face the sputtering cathodes 24. In this state, the gas introduction system 22 introduces the gas and the sputtering power source 26 is operated. As a result, the sputtering discharge is ignited. Particles, usually atoms, released from the target through the sputtering discharge reach the substrates 9, positing the thin film of the material of the target onto the substrates 9 thereby.

Showing an example of the thin-film deposition, a target made of indium-TiN-Oxcide (ITO) is sputtered for depositing an ITO film for a transparent electrode. Another target made of chromium (Cr) is sputtered for depositing a Cr film for a color filter.

In the described operation, the left load-lock chamber 11 is used only for conveying the unprocessed substrates 9, and the right load-lock chamber 11 is used only for carrying out the processed substrates 9. This is not indispensable. It is still possible to commonly use both load-lock chambers 11 for conveying in and out the substrates 9, or use each load-lock chamber 11 changing the role by turns. If the substrate holder 92 is moved between the left conveying mechanism 4L and the right load-lock chamber 11, the left conveying mechanism 4L must stay back at a further left position.

The described apparatus of this embodiment has prominent advantages as follows. First, the point that the substrates 9 are conveyed and processed posing vertically or nearly vertically brings the prominent advantage that enlargement of occupation area of the apparatus can be suppressed. Concretely, because the substrates 9 are conveyed and processed posing vertically or nearly vertically, occupation areas of the load-lock chambers 11, intermediate chamber 8 and the process chamber 2 may be much smaller than the case the substrates 9 are conveyed and processed posing horizontally. Especially when the substrates 9 are enlarged, the occupation area of each chamber must be enlarged to the same extent. Contrarily in the apparatus of this embodiment, the occupation area of each chamber may not be enlarged essentially, though its vertical length must be enlarged. Therefore, the whole occupation area of the apparatus may not be enlarged as well.

Such an apparatus as described is often provided in a clean room. Enlargement of the apparatus requires enlargement of the clean room, which increases costs for constructing and running the clean room. The apparatus of this embodiment has the advantage to reduce costs for building and running the clean room because its occupation area is not enlarged even if the substrate 9 is enlarged.

Additionally, the point that the substrate 9 is conveyed and processed posing vertically or nearly vertically brings the prominent advantage in preventing the substrate 9 from bending. When the substrate 9 is conveyed and processed posing horizontally, the substrate 9 would bend from its weight. Contrarily in this embodiment, the substrate 9 is held on the substrate holder 92, leaning on the substrate holder 92. Therefore, the substrate 9 does not bend from its weight. This is why there is no probability that; homogeneity of the process is decreased, a product defect such as display unevenness is brought, or such an accident as substrate breaking caused from non-uniform residual inside stress of the substrate 9 happens.

Furthermore, the point that the substrate 9 is conveyed and processed posing vertically or nearly vertically brings the advantage to make maintenance of the apparatus easier. As described, each chamber in the apparatus has a door for maintenance of the inside. Because the occupation area of each chamber is reduced in this embodiment, a large-size door is not required even if it is installed at the upper wall of each chamber. Because the front surface of the substrate 9 is directed to the side, the door may be installed at the side wall of each chamber. In this case, even a large-size door can be opened and closed easily by human force.

The holding angle θ was described as 45 degrees to 90 degrees. This is because the described advantages can not be brought at the holding angle θ below 45 degrees, which means that the substrate 9 poses nearly horizontally rather than vertically. The holding angle θ is more preferably 70 degrees to 85 degrees. If the holding angle θ is over 85 degrees, close to 90 degrees, the substrate 9 might not be held sufficiently on the substrate holder 92 only by leaning on it. In this case, the substrate 9 would fall down from the substrate holder 92 accidentally by some shock. To prevent this, a clamping mechanism that clamps the substrate 9 onto the substrate holder 92 may be provided. However, such the clamping mechanism makes the structure of the substrate holder 92 more complicated and makes it troublesome to load and unload the substrate 9. When the holding angle θ of 70 degrees or more is employed, the described advantages are enhanced.

Next, the point that the substrate 9 is conveyed along the second direction in addition to the first direction in the intermediate chamber 7 brings the following advantages. First, if the substrate 9 is conveyed only along the first direction, it is impossible to adopt any chamber layout except that the load-lock chambers 11 and the process chamber 2 are connected with the intermediate chamber 7 in a line. In other word, only the layout of the conventional in-line type can be adopted. As described, this layout has the problem the apparatus is lengthened in the aligning direction as the substrate 9 is enlarged.

Contrarily in this embodiment, because the substrate 9 can be conveyed along the second direction in addition to the first direction, a plurality of such chambers as the left-and-right load-lock chambers 11 can be provided side by side with the intermediate chamber 7. Therefore, the number of chambers can be increased without lengthening the apparatus. This is especially the advantage of the apparatus when it carries out many different processes continually, or needs many chambers for moderating pressure difference.

Second, the point that the substrate 9 is conveyed along the second direction in addition to the first direction in the intermediate chamber 7 brings the prominent advantage that the intermediate chamber 7 can have a buffering function. If the substrate 9 can be conveyed only along the first direction, the next substrate 9 can not be conveyed into the apparatus until the first substrate 9 is conveyed out of the apparatus after finishing the process in the process chamber 2 and returning it through the same route to the load-lock chamber 11. Contrarily in this embodiment, it is possible to convey the next substrate 9 into the apparatus during the process of the first substrate 9. It is also possible to convey the next substrate 9 to the process chamber 2 and to carry out the process onto the next substrate 9 in the process chamber 2, during conveying out the first substrate 9 to the atmosphere. Therefore, the apparatus of this embodiment is highly productive. This advantage is essentially the same as a case only one load-lock chamber 11 is provided. Of course, the described apparatus comprising two load-lock chambers 11 has the doubled efficiency in conveying in and out the substrate 9.

Additionally, as shown in FIG. 2, the first direction is along the upper and bottom edges of the substrate 9. This point brings the advantage to reduce the horizontal occupation area of the apparatus. If the substrate 9 is conveyed to a direction not along the upper and bottom edges, for example the direction perpendicular to the upper and bottom edges, then the substrate 9 is conveyed directing its front surface to the fore or back side. In this case, width required for conveying may correspond to width of the substrate 9. Therefore, the horizontal space required for conveying is wider than this embodiment. This means that the apparatus must be enlarged, which is more serious when the substrate 9 is enlarged. Contrarily, this embodiment does not have such the problem, being capable of minimizing the horizontal space required for conveying.

Furthermore, the described point also contributes to simplification of the gate valves. If the first direction is perpendicular to the upper and bottom edges of the substrate 9, the load-lock chambers 11 and the process chamber 2 would be connected with the intermediate chamber 7 at the longer side in the rectangular outlines. Therefore, the openings that must be opened and closed by the gate valves 10 are enlarged. This requires larger-scale gate valves such as those which are operated at greater driving force. Contrarily, this embodiment does not have such the problem, being capable of simplifying the gate valves.

Additionally, in this embodiment, the processed substrate 9 is turned back in the process chamber 2 and returned to either of the load-lock chambers 11 via the intermediate chamber 7. This feature is a kind of so-called "inter-back" type. This feature enables to convey in and out the substrate 9 at the same side of the apparatus. Therefore, the apparatus is easily built into a current production line.

Contrarily, the described in-line type apparatus needs wider space at both sides, because the substrate 9 is conveyed in at the one side and conveyed out at the other side. Therefore, this type of apparatus is difficult to be built into a current production line.

Because the apparatus of this embodiment comprises the heaters 6 in the intermediate chamber 7 having the buffering function, anther chamber for the pre-heating is not required. This point also brings the merits of the smaller occupation area and the cost reduction of the apparatus. Because the pre-heating can be carried out while another substrate 9 is processed, the lead-time of the apparatus is reduced, contributing to high productivity as well.

It is possible to provide the buffering function with the intermediate chamber 7. When pressure difference of the load-lock chamber 11 and the process chamber 2 is large, pressure in the intermediate chamber is preferably kept at intermediate value for buffering.

Figure 5:
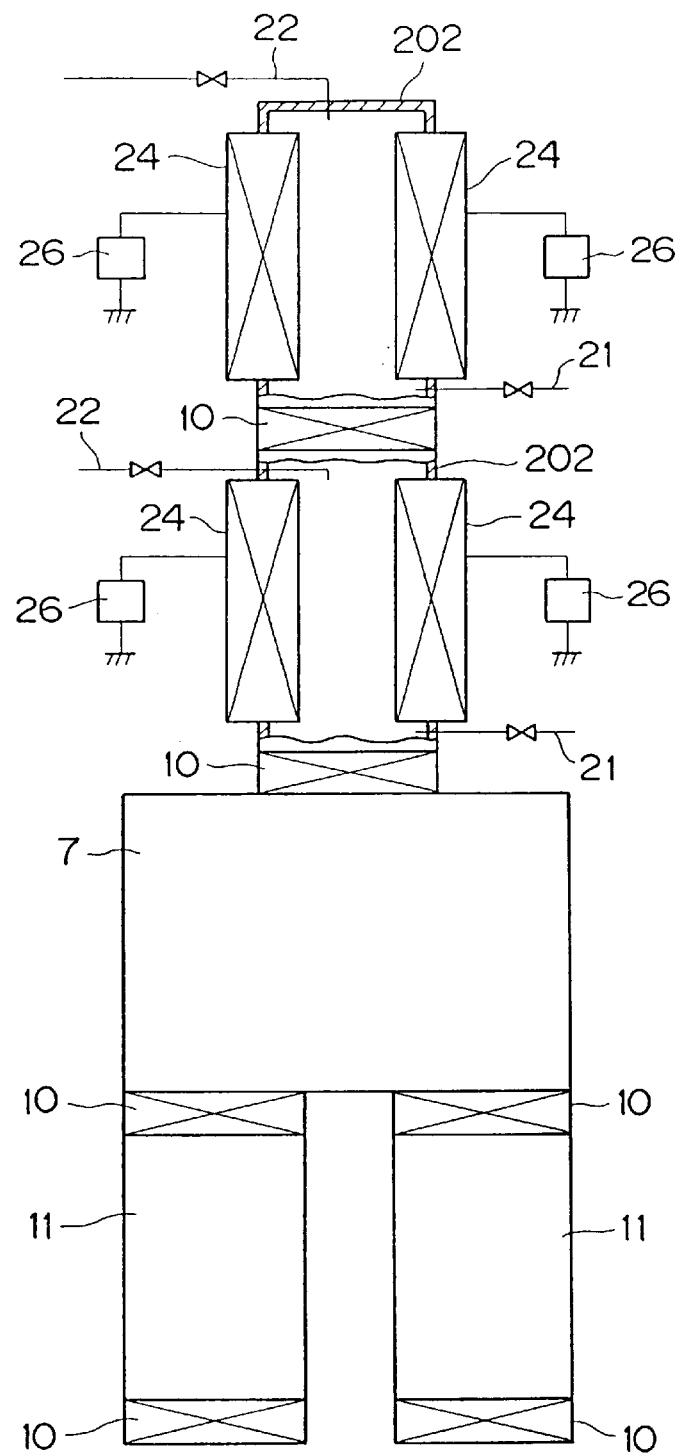
FIG. 5 is a schematic plan view of the apparatus of the second embodiment.
Figure 6:
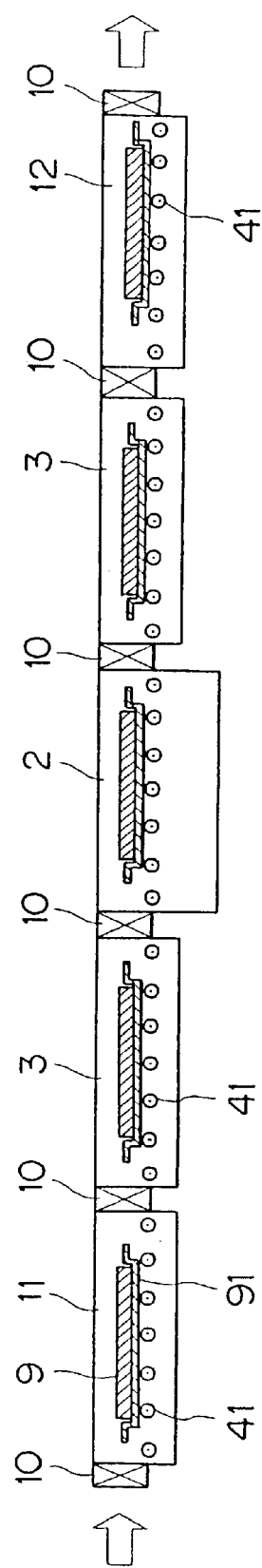
FIG. 6 schematically shows an in-line type apparatus as an example of conventional substrate processing apparatuses.
Figure 7:
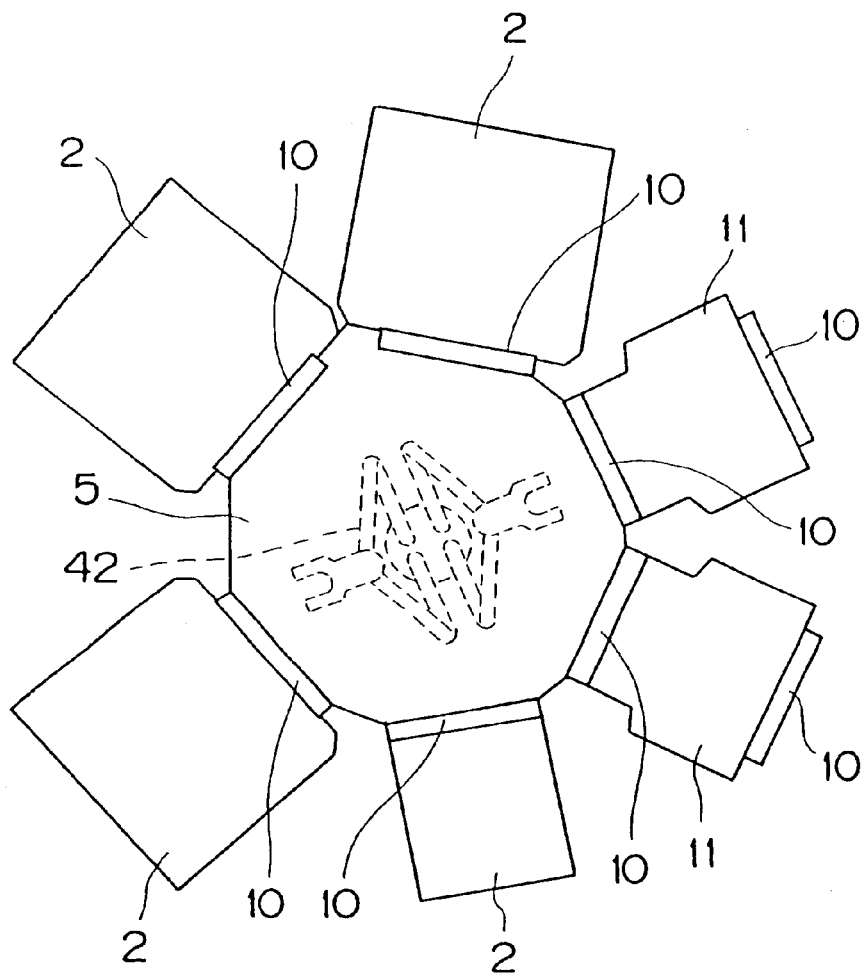
FIG. 7 schematically shows a cluster-tool type apparatus as another example of conventional substrate processing apparatuses.

Next, the second embodiment of the invention is described. FIG. 5 is a schematic plan view of the apparatus of the second embodiment. The apparatus shown in FIG. 5 is different from the first embodiment in that a couple of process chambers is provided. Descriptions about other points are omitted because they are essentially the same as those in the first embodiment.

The couple of process chambers is hereinafter the first process chamber 201 and the second process chamber 202 as shown in FIG. 5. The first process chamber 201 corresponds to the process chamber 2 in the first embodiment. The second process chamber 202 is aligned with the first process chamber 201 as in the in-line type apparatuses.

In the second process chamber 202 as well, a combination of a row of pinions, a pinion drive unit and a guide rail, which are the same as those of the first embodiment, is provided (not shown). These components are aligned with the counter-components in the first process chamber 201. By the rack-and-pinion mechanism composed of those components, the substrate holder 92 is moved between the first process chamber 201 and the second process chamber 202.

The second process chamber 202 is designed adequately as well as the first process chamber 201. Following description is the case that sputtering is carried out in the process chamber 202 as well. Therefore, components in the second process chamber 202 are essentially the same as in the process chamber 2 in FIG. 1.

In the case that a titanium nitride film is deposited on a titanium film, for example, the targets in the first and second process chambers 201, 202 are made of titanium. The gas introduction system of the first process chamber 201 introduces argon, and the gas introduction system of the second process chamber 202 introduces gas mixture of nitrogen and argon. The titanium film is deposited on the front surface of the substrate 9 through the sputtering of the titanium target in the first process chamber 201. The titanium nitride film is deposited on the deposited titanium film through the sputtering of the titanium target and the reaction of nitrogen and titanium in the second process chamber 202.

In the above sputtering processes, if nitrogen in the second process chamber 202 diffuses to the first process chamber 201, the surface of the target in the first process chamber 201 may be contaminated. Therefore, diffusion of nitrogen is preferably prevented. This is enabled by providing a gate valve 10 between the first and second process chambers 201, 202. To pump the first and second process chambers 201, 202 so that pressure in the first process chamber 201 can be higher than that in the second process chamber 202, i.e., differential pumping, is more preferable, because the pumping systems are simplified.

Though two process chambers 201, 202 are provided in a line, three or more process chambers may be provided in a line. Otherwise, two or three (or more) process chambers may be provided to the intermediate chamber 7 side by side, as the load-lock chambers 11 in the first embodiment. In this case, because a couple of process-side conveying positions is required in the intermediate chamber 7, length of the intermediate chamber 7 along the second direction is made larger. However, compared with the conventional layout where a plurality of chambers is aligned, the problem of occupation area enlargement of the apparatus is not serious.

Though the rack-and-pinion mechanism is adopted in the described embodiments, this is not limitative. For example, two rows of a multiplicity of conveying rollers that are rotated around vertical axes may be provided along the first direction. The respective conveying rollers are brought into contact with both side surfaces of the support board 924 with adequate friction force. By rotating the conveying rollers of each row opposite to each other, the substrate holder 92 can be moved to the first direction.

The mechanism for moving the substrate holder 92 to the second direction can be modified as well. For example, a ball screw (precise screw) may be provided at the intermediate position of two guide rods 471 in FIG. 2. The ball screw is made in parallel to the guide rods 471. A driven head having a through-hole which surface engages with the ball screw is fixed on the under surface of the base board 46. By rotating the ball screw by a servomotor, the substrate holder 92 can be moved to the second direction.

When the substrate 9 is heated up to high a temperature during the process in the process chambers 2, 201, 202, the intermediate chamber 7 may comprise a cooling mechanism. The cooling mechanism, for example, may be one that cools by contacting a cooled member onto the back surface of the substrate 9 or the substrate holder 92.

In addition to the described sputtering process, the apparatus of this invention can be modified so that another process can be carried out. Concretely, process carried out in the apparatus of this invention may be another deposition process such as chemical vapor deposition or physical vapor deposition, etching, or surface denaturalizing. The substrate 9 as the object of the process is not limitative either. The apparatus of this invention may process a substrate for an information storage media such as a hard disk, or a substrate for a printed circuit.

What is claimed is:

1. A substrate processing apparatus comprising:
    a substrate holder for holding a substrate with a holding angle of 45 degrees to 90 degrees,
    a conveying system to convey the substrate by moving the substrate holder,
    a process chamber in which the substrate is processed,
    a load-lock chamber in which the substrate temporarily stays in conveying between an outside atmosphere and the process chamber,
    an intermediate chamber provided between the process chamber and the load-lock chamber,
    wherein the holding angle is an angle between the substrate and a horizontal plane,
    the conveying system conveys the substrate between the load-lock chamber and the intermediate chamber, and between the intermediate chamber and the process chamber,
    the conveying system conveys the substrate along a first direction that is a direction from the load-lock chamber to the intermediate chamber or a direction from the intermediate chamber to the process chamber, and
    the conveying system also conveys the substrate along a second direction that is perpendicular to the first direction.

2. A substrate processing apparatus as claimed in claim 1, wherein the first direction is a horizontal direction perpendicular to a plane where the holding angle with the substrate is formed.

3. A substrate processing apparatus as claimed in claim 1, wherein;
    the direction from the load-lock chamber to the intermediate chamber is the same as the direction from the intermediate chamber to the process chamber,
    the load-lock chamber is provided at one side of the intermediate chamber,
    the process chamber is provided at the opposite side of the intermediate chamber,
    the conveying system turns back the substrate holder in the process chamber and returns to the load-lock chamber via the intermediate chamber.

4. A substrate processing apparatus as claimed in claim 1, wherein;
    the direction from the load-lock chamber to the intermediate chamber is the same as the direction from the intermediate chamber to the process chamber,
    the load-lock chamber is provided at one side of the intermediate chamber,
    a plurality of the process chambers is provided at the opposite side of the intermediate chamber along a conveying line.

5. A substrate processing apparatus as claimed in claim 1, wherein;
    a heater for heating the substrate prior to the process in the process chamber is provided in the intermediate chamber.

6. A substrate processing apparatus as claimed in claim 1, wherein;
    a plurality of the load-lock chambers is provided side by side with the intermediate chamber.

7. A substrate processing apparatus as claimed in claim 1, wherein;
    the substrate holder holds a plurality of the substrates at the same time.

8. A substrate processing apparatus as claimed in claim 1, wherein the substrate holder holds the substrate at the holding angle of 70 degrees to 85 degrees.

9. A substrate processing apparatus as claimed in claim 1, wherein the conveying system actuates the substrate holder such that after processing in the process chamber, the substrate is returned via a same intermediate chamber.

10. A substrate processing apparatus as claimed in claim 7, wherein said substrate holder holds two substrates on two sides thereof.

11. A substrate processing apparatus as claimed in claim 1, wherein said conveying system conveys the substrate holder in the second direction inside the intermediate chamber, said first and second directions being located in a horizontal plane.

* * * * *